United States Patent
Konno et al.

(10) Patent No.: US 9,359,692 B2
(45) Date of Patent: *Jun. 7, 2016

(54) METAL CHLORIDE GAS GENERATOR, HYDRIDE VAPOR PHASE EPITAXY GROWTH APPARATUS, AND METHOD FOR FABRICATING A NITRIDE SEMICONDUCTOR TEMPLATE

(71) Applicant: Hitachi Cable, Ltd., Tokyo (JP)

(72) Inventors: Taichiroo Konno, Hitachi (JP); Hajime Fujikura, Mito (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 536 days.

This patent is subject to a terminal disclaimer.

(21) Appl. No.: 13/794,522

(22) Filed: Mar. 11, 2013

(65) Prior Publication Data

US 2013/0247817 A1     Sep. 26, 2013

(30) Foreign Application Priority Data

Mar. 21, 2012   (JP) ................................. 2012-063514
Dec. 25, 2012   (JP) ................................. 2012-280482

(51) Int. Cl.
C30B 25/02         (2006.01)
C30B 25/14         (2006.01)
(Continued)

(52) U.S. Cl.
CPC ................. *C30B 25/14* (2013.01); *C30B 25/02* (2013.01); *C30B 25/16* (2013.01); *C30B 29/403* (2013.01)

(58) Field of Classification Search
CPC ........ C30B 25/02; C30B 25/16; C30B 25/165
See application file for complete search history.

(56) References Cited

U.S. PATENT DOCUMENTS 6,596,079 B1   7/2003   Vaudo et al.
6,812,051 B2   11/2004  Usui et al.
(Continued)

FOREIGN PATENT DOCUMENTS

JP   2002-305155 A   10/2002
JP   2005-223243 A   8/2005
(Continued)

OTHER PUBLICATIONS

United States Notice of Allowance dated Sep. 3, 2015 in co-pending U.S. Appl. No. 13/569,983.

(Continued)

*Primary Examiner* — Robert M Kunemund
(74) *Attorney, Agent, or Firm* — McGinn IP Law Group, PLLC

(57) ABSTRACT

A metal chloride gas generator includes a reactor including a receiving section for receiving a metal on an upstream side and a growing section in which a growth substrate is placed on a downstream side, a raw material section heater and a growing section heater each of which heats an inside of the reactor, an upstream end comprising a gas inlet, and a gas inlet pipe arranged to extend from the upstream end via the receiving section to the growing section, for introducing a chloride gas from the upstream end to supply the chloride gas to the receiving section and supplying a metal chloride gas produced by a reaction between the chloride gas and the metal in the receiving section to the growing section. The gas inlet pipe includes a suppressing section for suppressing an optical waveguiding phenomenon which waveguides a radiant heat from the growing section heater or the growing section.

8 Claims, 14 Drawing Sheets

(51) Int. Cl.
*C30B 25/16* (2006.01)
*C30B 29/40* (2006.01)

(56) References Cited

U.S. PATENT DOCUMENTS

| | | |
|---|---|---|
| 7,556,688 B2 | 7/2009 | Melnik et al. |
| 8,858,708 B1 | 10/2014 | Callahan et al. |
| 2003/0017685 A1 | 1/2003 | Usui et al. |
| 2007/0026999 A1 | 2/2007 | Jang et al. |
| 2011/0073039 A1 | 3/2011 | Colvin |

FOREIGN PATENT DOCUMENTS

| | | |
|---|---|---|
| JP | 2005-303168 A | 10/2005 |
| JP | 3886341 B2 | 2/2007 |
| KR | 10-0943091 B1 | 2/2010 |

OTHER PUBLICATIONS

Chinese Office Action dated Apr. 6, 2016 with an English translation thereof.

60 GAS INLET PIPE (EXAMPLE 1)

◄—— UPSTREAM SIDE　　　DOWNSTREAM SIDE ——►

60 GAS INLET PIPE (COMPARATIVE EXAMPLE 1)

METAL CHLORIDE GAS GENERATOR, HYDRIDE VAPOR PHASE EPITAXY GROWTH APPARATUS, AND METHOD FOR FABRICATING A NITRIDE SEMICONDUCTOR TEMPLATE

The present application is based on Japanese patent application No. 2012-63514 filed on Mar. 21, 2012 and Japanese patent application No. 2012-280482 filed on Dec. 25, 2012, the entire contents of which are incorporated herein by reference.

BACKGROUND OF THE INVENTION

1. Field of the Invention

This invention relates to a metal chloride gas generator, a hydride vapor phase epitaxy growth apparatus, and a method for fabricating a nitride semiconductor template.

2. Description of the Related Art

Gallium nitride compound semiconductors, such as gallium nitride (GaN), aluminum gallium nitride (AlGaN), and indium gallium nitride (InGaN) have attracted attention as light-emitting device materials capable of red through ultraviolet light emission. One growing method for these gallium nitride compound semiconductor crystals is a Hydride Vapor Phase Epitaxy (HVPE) growing method using metal chloride gas and ammonia as raw material.

A feature of the HVPE method is as follows. According to this method, it is possible to obtain a growth rate of 10 μm/hr to 100 μm/hr or higher which is remarkably higher than a typical growth rate of several μm/hr in other growing methods such as Metal Organic Vapor Phase Epitaxy (MOVPE) and Molecular Beam Epitaxy (MBE). For this reason, the HVPE method has been often used in the manufacture of a GaN free-standing substrate (see e.g. JP Patent No. 3886341) and an AlN free-standing substrate. Here, the term "free-standing substrate" refers to a substrate having such strength to hold its own shape and not to cause inconvenience in handling.

In addition, a light-emitting diode (LED) made of a nitride semiconductor is typically formed over a sapphire substrate. In its crystal growth, after a buffer layer is formed over a surface of the substrate, a GaN layer having a thickness of the order of 6 to 15 μm including an n-type layer is grown thereover, and an InGaN/GaN multiple quantum well light-emitting layer (several hundreds nm thick in total) and a p-type layer (200 to 500 nm thick) are grown thereover in this order. The GaN layer under the light-emitting layer is thick in order to improve the crystallinity of GaN on the sapphire substrate and the like. This is followed by electrode formation, resulting in a final device structure as shown in FIG. 11 which will be described later. In the case of growth with the MOVPE method, the crystal growth typically requires about 6 hours, and about half of 6 hours is the time required to grow a so-called "template portion" that are GaN layers under the light-emitting layer.

From the above, it is supposed, if it is possible to apply the HVPE method with the remarkably high growth rate to the growth of the template, it will be possible to substantially shorten the growth time, thereby dramatically reduce LED wafer manufacturing cost. In growing the template portion with the HVPE method which can lower the production cost, however, due to contamination by many unintended impurities, it is difficult to fabricate the good quality template.

For the HVPE apparatus used for manufacturing the nitride semiconductor, Ga, $NH_3$ gas, HCl gas are generally used as main raw material. In addition, the growth temperature required for effectively forming a film is a high temperature, namely, not lower than 1000 degrees Celsius. For this reason, a material to be used for a gas inlet pipe and a reactor is e.g. quartz that is chemical resistant and heat resistant to $NH_3$ gas and HCl gas that are highly reactive at high temperature. Specifically, the HVPE apparatus has a structure as shown in FIG. 12 which will be described later, and has a tube reactor made of quartz divided into a raw material section on its upstream side (i.e. upstream raw material section) and a growing section on its downstream side (i.e. downstream growing section), and an upstream open end of the reactor is closed by an upstream flange made of stainless steel (SUS), and the gas inlet pipes made of quartz are installed through the upstream flange from the raw material section towards the growing section. Because the gas inlet pipes made of quartz cannot be attached directly to the upstream flange, a pipe made of SUS is connected to an outer side of an upstream end of each of the gas inlet pipes, and this pipe is attached to the upstream flange (see e.g. JP-A-2002-305155). This technique is very ordinary, and it would not be an exaggeration to say that all HVPE apparatuses utilize this technique.

SUMMARY OF THE INVENTION

In the above-configured HVPE apparatus, however, radiant heat from the growing section the temperature of which is the highest in the apparatus is conducted to the pipe, so that the temperature of the pipe portion is also high. When the temperature of the pipe is high, the gas flowing through the pipe tends to react with the constituent material of the pipe, and the constituent material of the pipe may be scraped off (corroded) by this gas, and the nitride semiconductor template may be contaminated with this corroded constituent material of the pipe portion as unintended impurities. Particularly, the impurity contaminations are significantly due to interfusion of impurities from the pipe portion through which the corrosive $NH_3$ or HCl gas flows.

Through the specification and claims, the "nitride semiconductor template" or simply "template" means a device which includes a substrate and nitride semiconductor layer(s) e.g. GaN layers to be provided under a light-emitting layer, and may further include a buffer layer or the like. Further, the "template portion" means the nitride semiconductor layer(s) in the "nitride semiconductor template".

Accordingly, it is an object of the present invention to provide a metal chloride gas generator, a hydride vapor phase epitaxy growth apparatus, and a method for fabricating a nitride semiconductor template, by which the interfusion of unintended impurities into the nitride semiconductor template is suppressed.

As a result of earnest study to achieve the above described problem, the inventors have found that the nitride semiconductor template made by using the metal chloride gas generator to be used at not lower than 1000° C. is contaminated by unintended impurities because the constituent material of the pipe is corroded by the gas flowing in the high temperature SUS pipe at the gas inlet and interfuses into the template as the unintended impurities.

By reducing the radiant heat from the heater, it is possible to suppress the rise in temperature of the SUS pipe portion at the gas inlet to some extent. The Inventors however found that the above-mentioned method has a limit. The reason thereof can be described as follows. The Inventors found that the contamination by unintended impurities is caused by the effect of the high temperature of the SUS pipe portion at the gas inlet due to the gas inlet pipe acting as an optical waveguide, more specifically, because the quartz material of the above gas inlet pipe is a light transmissive material.

For this reason, in order to suppress the temperature rise in the SUS pipe portion at the gas inlet, the gas inlet pipe made of quartz material is partially made opaque. As a result, the Inventors found that it is possible to suppress the optical waveguiding phenomenon in the metal chloride gas generator and the hydride vapor phase epitaxy growth apparatus, thereby suppress the interfusion of unintended impurities into the nitride semiconductor layers constituting the nitride semiconductor template.

Here, the "optical waveguiding phenomenon" refers to a radiant heat waveguiding phenomenon due to the gas inlet pipe acting as an optical waveguide. The radiant heat caused at the downstream side of the gas inlet pipe (specifically, the radiant heat from the growing section of the metal chloride gas generator) is suppressed by a suppressing section of the gas inlet pipe, and the heat is less likely to be conducted to the upstream end to suppress the temperature rise in the upstream end. According to this structure, the gas introduced from the gas inlet pipe is suppressed from being contaminated by the constituent material of the pipe as impurities at the upstream end.

According to a first feature of the invention, a metal chloride gas generator comprises:

a reactor including a receiving section for receiving a metal on an upstream side and a growing section in which a growth substrate is placed on a downstream side;

a raw material section heater and a growing section heater each of which heats an inside of the reactor;

an upstream end comprising a gas inlet; and a gas inlet pipe arranged to extend from the upstream end via the receiving section to the growing section, for introducing a chloride gas from the upstream end to supply the chloride gas to the receiving section and supplying a metal chloride gas produced by a reaction between the chloride gas and the metal in the receiving section to the growing section, wherein the gas inlet pipe comprises a suppressing section for suppressing an optical waveguiding phenomenon which waveguides a radiant heat from the growing section heater or the growing section.

The gas inlet pipe may comprise a quartz glass and the suppressing section comprises an opaque section comprising an opaque quartz glass.

A longitudinal length of the opaque section of the gas inlet pipe is preferably not less than 10 mm and not more than 200 mm.

The receiving section may comprise a Ga tank and the opaque section of the gas inlet pipe is located between the upstream end and the Ga tank.

The suppressing section of the gas inlet pipe may comprise a convex portion provided at the gas inlet pipe.

The metal chloride gas generator may further comprise a heat shield plate provided in the reactor for thermally shielding between the upstream end and the growing section.

According to a second feature of the invention, a hydride vapor phase epitaxy growth apparatus comprises:

the metal chloride gas generator according to the first feature.

According to a third feature of the invention, a method for fabricating a nitride semiconductor template comprises a nitride semiconductor provide on a heterogeneous substrate, the method comprising:

arranging the heterogeneous substrate at a downstream side of a reactor comprising a growing section heater for heating the heterogeneous substrate at a predetermined temperature and a gas inlet pipe at an upstream side, and supplying a source gas containing a corrosive gas over the heterogeneous substrate through the gas inlet pipe at the upstream side, the gas inlet pipe comprising a suppressing section for suppressing an optical waveguiding phenomenon which waveguides a heat radiant from the growing section heater or the heterogeneous substrate, to make the nitride semiconductor layer contain chlorine, iron with a concentration of less than $1\times10^{17}$ cm$^{-3}$ and chromium with a concentration of less than $1\times10^{16}$ cm$^{-3}$.

EFFECTS OF THE INVENTION

According to the present invention, it is possible to suppress the optical waveguiding phenomenon in a metal chloride gas generator or a hydride vapor phase epitaxy growth apparatus, and to provide a method for fabricating a nitride semiconductor template, by which the interfusion of unintended impurities into the nitride semiconductor template is suppressed.

BRIEF DESCRIPTION OF THE DRAWINGS

The preferred embodiments according to the invention will be explained below referring to the appended drawings, wherein.

DETAILED DESCRIPTION OF THE PREFERRED EMBODIMENTS

Figure 1:
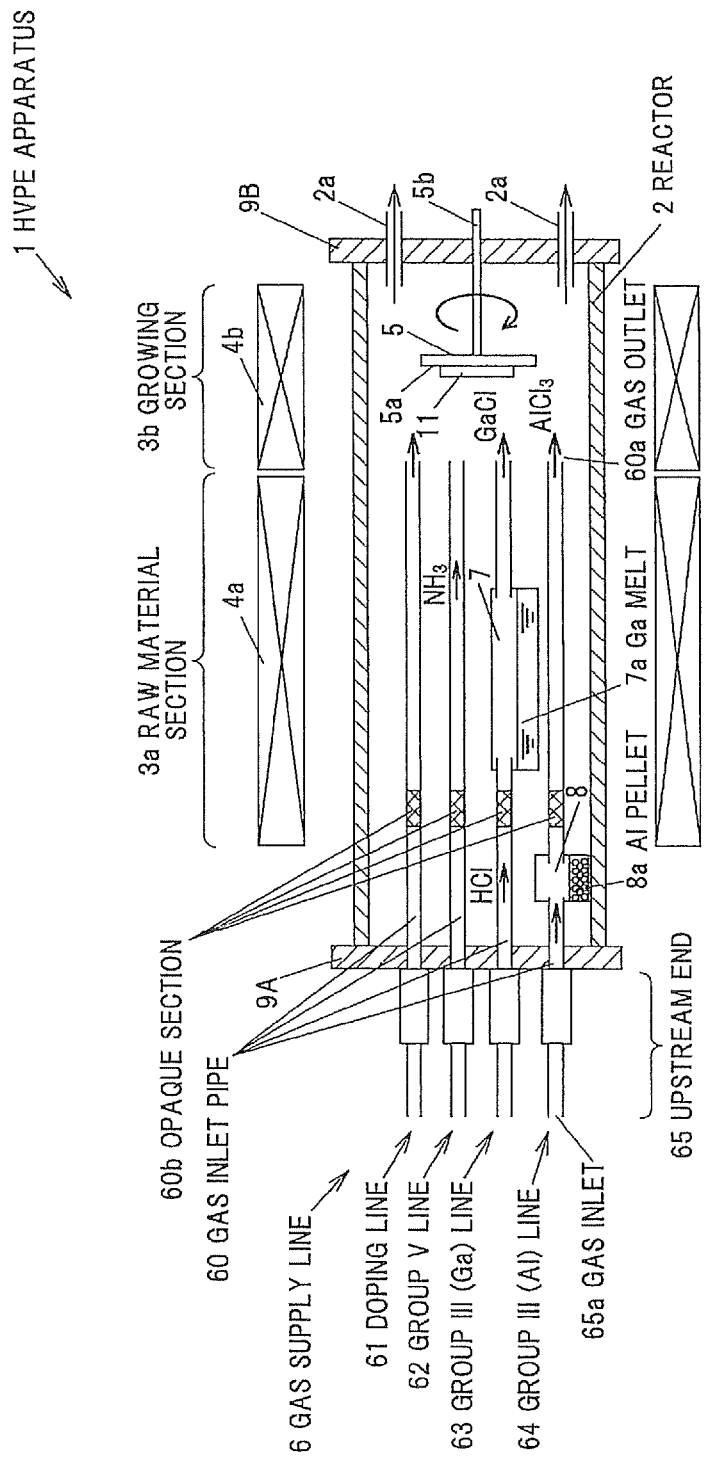
FIG. 1 is a diagram showing an example of schematic configuration of an HVPE apparatus in the first embodiment according to the present invention.

Next, preferred embodiments according to the invention will be described in more detail in conjunction with the appended drawings. It should be noted that in each figure, for components having substantially the same functions, duplicate description thereof will be omitted given the same reference numerals.

SUMMARY OF THE EMBODIMENT

A metal chloride gas generator in this embodiment comprises a reactor including a receiving section for receiving a metal on an upstream side and a growing section in which a growth substrate is placed on a downstream side; a raw material section heater and a growing section heater each of which heats an inside of the reactor; an upstream end comprising a gas inlet; and a gas inlet pipe arranged to extend from the upstream end via the receiving section to the growing section, for introducing a chloride gas from the upstream end to supply the chloride gas to the receiving section and supplying a metal chloride gas produced by a reaction between the chloride gas and the metal in the receiving section to the growing section, in which the gas inlet pipe comprises a suppressing section for suppressing an optical waveguiding phenomenon which waveguides a radiant heat from the growing section heater or the growing section.

The suppressing section of the gas inlet pipe may be an opaque section made of an opaque quartz glass (silica glass). The suppressing section of the gas inlet pipe may be constituted from a convex portion (protruded portion) formed at the gas inlet pipe. Since the radiant heat is scattered at the convex portion, the heat is less likely to be conducted to the upstream end.

A heat shield plate which thermally shields between an upstream end side portion and a growing section side portion may be provided in the reactor. According to this structure, the radiant heat is less likely to be thermally conducted to the upstream end, and the temperature of the upstream end is even further suppressed from rising.

In addition, the hydride vapor phase epitaxy growth apparatus (hereinafter, referred to as "HVPE apparatus") in this embodiment is equipped with the above described metal chloride gas generator.

As to a method for fabricating a nitride semiconductor template comprising a nitride semiconductor provide on a heterogeneous substrate, the method comprises arranging the heterogeneous substrate at a downstream side of a reactor comprising a growing section heater for heating the heterogeneous substrate at a predetermined temperature and a gas inlet pipe at an upstream side, and supplying a source gas containing a corrosive gas over the heterogeneous substrate through the gas inlet pipe at the upstream side, the gas inlet pipe comprising a suppressing section for suppressing an optical waveguiding phenomenon which waveguides a heat radiant from the growing section heater or the heterogeneous substrate, to make the nitride semiconductor layer contain chlorine, iron with a concentration of less than $1\times10^{17}$ cm$^{-3}$ and chromium with a concentration of less than $1\times10^{16}$ cm$^{-3}$.

The nitride semiconductor template fabricated by the HVPE apparatus comprises a plurality of nitride semiconductor layers formed over the heterogeneous substrate and made of a homogeneous material different from that of the heterogeneous substrate. The nitride semiconductor template in the present embodiment is a nitride semiconductor template comprising a chlorine-containing nitride semiconductor layer containing an iron concentration of less than $1\times10^{17}$ cm$^{-3}$ and an chromium concentration of less than $1\times10^{16}$ cm$^{-3}$, namely the nitride semiconductor layer containing chlorine, iron with the concentration of less than $1\times10^{17}$ cm$^{-3}$ and chromium with the concentration of less than $1\times10^{16}$ cm$^{-3}$.

The reason for providing the chlorine-containing nitride semiconductor layer is explained as follows. In the present invention, the nitride semiconductor layer is grown by the HVPE method. In the film formation by the HVPE method, GaCl is produced by using a chloride gas such as hydrogen chloride (HCl) or chlorine as a raw material, and a GaN film is formed by using the GaCl thus produced as a Ga source, so that slight amount of Cl is inevitably contained in an epitaxial layer. On the other hand, in the film formation by the other method such as MOVPE method, TEG (triethyl gallium) or TMG (trimethyl gallium) is used as the Ga source and a chlorine-containing material is not used, so that Cl is not contained in an epitaxial layer. Therefore, it is possible to confirm whether the film formation is conducted by the HVPE method or not by analyzing the Cl concentration in the epitaxial layer.

In the above nitride semiconductor template, a full width at half maximum (FWHM) of a (0004) plane of X-ray diffraction (XRD) is preferably not less than 180 seconds and not more than 400 seconds when a flat sapphire substrate is used. The above nitride semiconductor template may have a Si-doped GaN layer containing a Si concentration of not less than $5\times10^{18}$ cm$^{-3}$ and not more than $5\times10^{19}$ cm$^{-3}$.

The full width at half maximum (FWHM) of the (0004) plane of the nitride semiconductor layer of X-ray diffraction (XRD) is preferably not less than 50 seconds and not more than 300 seconds when a patterned sapphire substrate (PSS) is used. In the case of using the PSS, the FWHM becomes narrower than the FWHM in the case of using the flat substrate, because of an ELO (Epitaxially Lateral Overgrowth) effect due to the irregularity of a substrate surface.

First Embodiment

FIG. 1 is a diagram showing an example of schematic configuration of an HVPE apparatus 1 in the first embodiment according to the present invention. This HVPE apparatus 1 is divided into a raw material section 3a on an upstream side and a growing section 3b on a downstream side, and the row material section 3a and the growing section 3b are heated by separate raw material section heater 4a and growing section heater 4b to about 850 degrees Celsius and 1100 degrees Celsius, respectively.

In addition, an HVPE apparatus 1 has a tubular reactor 2, and an upstream open end of the reactor 2 is closed by an upstream flange 9A made of stainless steel (SUS), while a downstream open end of the reactor 2 is closed by a downstream flange 9B made of SUS. Four system gas supply lines 6 of a doping line 61, a group V line 62, group III (Ga) line 63, and a group III (Al) line 64 are installed through the upstream flange 9A from the raw material section 3a towards the growing section 3b.

(Configuration of the Gas Supply Lines)

The doping line 61, the group V line 62, the group III (Ga) line 63 and the group III (Al) line 64 are constituted by the same gas inlet pipes 60. Each of the gas inlet pipes 60 is arranged to extend from an upstream end 65 having a gas inlet 65a towards the growing section 3b. It should be noted that the group III (Ga) line 63 is arranged to extend via a Ga tank 7 (to be described later) towards the growing section 3b and the group III (Al) line 64 is arranged to extend via an Al tank 8 (to be described later) towards the growing section 3b.

The gas inlet pipe 60 made of quartz is formed from e.g. a high purity silica (SiO$_2$). As the quartz glass, e.g. molten quartz glass may be used. Because the gas inlet pipe 60 made of quartz cannot be attached directly to the upstream flange 9A, the upstream end 65 having a pipe made of SUS or the like connected to an outer side of an upstream end of each of the gas inlet pipes 60 is attached to the upstream flange 9A.

As to the gas inlet pipe 60, a total length of the inlet pipe made of quartz is not specifically determined and selected appropriately. For example, in the present embodiment, various lengthy inlet pipes made of quartz with a total length of e.g. 30 cm to 1 m may be used.

The gas supply line 6 includes an opaque section 60b made of an opaque quartz as a part of the gas inlet pipe 60. It is configured for suppressing the rise in temperature in a vicinity of the entrance of the gas supply line 6 to the reactor 2. Since the gas inlet pipe 60 is made of quartz, thereby functions as an optical waveguide, the radiant heat from a portion heated by the raw material section heater 4a and the growing section heater 4b is conducted to the upstream end 65, which causes the rise in temperature of the upstream end 65. The opaque section 60b suppresses the optical waveguiding effect (phenomenon), thereby suppressing the rise in temperature in vicinity of the gas inlet 65a (upstream end 65) of the gas supply line 6.

The quartz tube having the opaque section 60b is such manufactured that the inlet pipe made of quartz is partially opaque (namely, a part of the inlet pipe is opaque) prior to the assembling. For example, the opaque section 60b is formed by so-called flame fusion method. Here, the gas inlet pipe 60 may be constituted by connecting a pipe made of opaque quartz glass (opaque section 60b) and pipe(s) made of transparent quartz glass. A range (portion) to be opaque is preferably not less than 10 mm and not more than 200 mm in the total length of the inlet pipe. Further, the gas inlet pipe 60 may be constituted from transparent synthetic quartz glass, and convexo-concave portions (irregular surface processing) may be provided inside or outside of a portion of the gas inlet pipe 60, or alternatively inside and outside of the portion of the gas inlet pipe 60. For example, a part of the pipe inlet pipe 60 may be processed by sand blasting to provide the opacity such as fogged glass. Regardless of the length of the inlet pipe to be used, the length of the opaque section 60b may be set within the above range.

The length of the opaque section 60b is at least 10 mm, and the effect of suppressing the rise in temperature can be enhanced in accordance with the increase in length of the opaque section 60b. Although it is conceivable to make the gas supply line 6 entirely from the opaque section 60b, the precision of the shape of the gas supply line 6 will be deteriorated if the entire part of the gas supply line 6 is made of the opaque section 60b, which may cause troubles in attaching the gas supply line 6 to the portion in vicinity of the gas inlet 65a (upstream end 65). The preferable length of the opaque section 60b is therefore about 10 mm to 200 mm.

All the gas supply lines 60 in the metal chloride gas generator or the HVPE apparatus may be provided as inlet pipes made of quartz each of which comprises the opaque section 60b. Alternatively, some of the gas supply lines 60 to be used may be provided as inlet pipes made of quartz each of which comprises the opaque section 60b. Obviously, the effect of suppressing the interfusion of unnecessary impurities will be enhanced by providing all the gas supply lines 60 as the inlet pipes made of quartz each of which comprises the opaque section 60b. However, the effect of suppressing the optical waveguiding phenomenon can be achieved to some extent by providing at least the group III (Ga) line 63 and the group III (Al) line 64 through which HCl (a corrosive gas) flows as the quartz-inlet pipes with the opaque section 60b.

(Gases to be Supplied from the Gas Supply Lines)

From the doping line 61, for the case that the doping is not carried out, e.g., when an undoped GaN layer (un-GaN layer) is grown, hydrogen, nitrogen or a mixture gas of hydrogen and nitrogen is introduced. When an n-type GaN layer (n-GaN layer) is grown, dichlorosilane (diluted with hydrogen, 100 ppm) as Si source and HCl gas together with hydrogen, nitrogen or a mixture gas of hydrogen and nitrogen are introduced. Further, from the doping line 61, when the baking process is carried out to remove GaN-based deposits attached in the HVPE apparatus 1 after the HVPE growth, HCl gas together with hydrogen, nitrogen or a mixture gas of hydrogen and nitrogen are introduced.

From the group V line 62, hydrogen, nitrogen, or a mixture of hydrogen and nitrogen is supplied as a carrier gas together with ammonia ($NH_3$) as a nitrogen source.

From the group III (Ga) line 63, hydrogen, nitrogen, or a mixture of hydrogen and nitrogen is supplied as a carrier gas together with hydrogen chloride (HCl) to provide chloride gas. In the middle of the Group III (Ga) line 63, the Ga tank 7 made of high purity quartz (high purity silica) as a receiving section that receives a gallium metal (Ga) melt 7a is installed. In the Ga tank 7, GaCl gas as metal chloride gas is generated by the reaction of Ga metal and HCl gas and sent to the growing section 3b.

Figure 2:
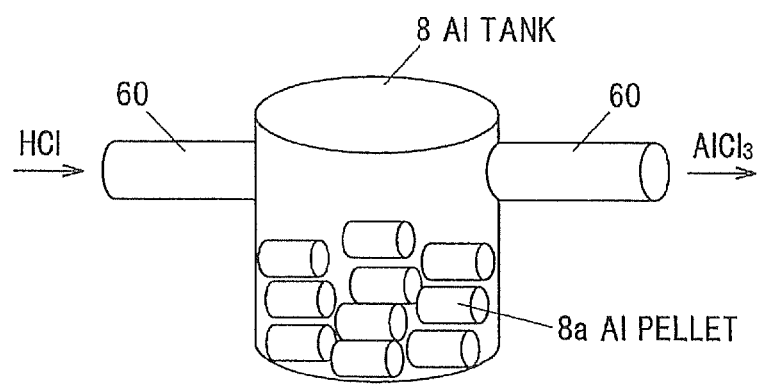
FIG. 2 is an enlarge schematic diagram showing an Al tank in the first embodiment according to the present invention.

From the group III (Al) line 64, hydrogen, nitrogen, or a mixture of hydrogen and nitrogen is supplied as a carrier gas together with hydrogen chloride (HCl) to provide chloride gas. As shown in FIG. 2, in the middle of the Group III (Al) line 64, the Al tank 8 made of high purity silica as a receiving section that receives Al metal pellets 8a is installed. In the Al tank 8, $AlCl_3$ gas as metal chloride gas is generated by the reaction of Al metal and HCl gas and sent to the growing section 3b. The Al tank 8 is located in an area with a temperature range in which the Al metal pellets 8a will not melt. It is because that AlCl will be generated by the reaction of the HCl gas and Al pellets 8a if the Al pellets 8a are molten, and the quartz materials in the HVPE apparatus 1 will be corroded by AlCl. The group III (Ga) line 63, the group III (Al) line 64, the Ga tank 7, and the Al tank 8 constitute the metal chloride gas generator.

(Growing Section)

In the growing section 3b, a tray 5 which rotates at a rotational speed of about 3 to 100 r/min is installed, and a sapphire substrate 11 is installed on a plane (installation plane) 5a which faces to a gas outlet 60a of each of the gas supply lines 6. The source gas flown from the sapphire substrate 11 towards the downstream side is evacuated through an exhaust pipe 2a from a most downstream part. The growth in the present embodiment, embodiments to be described later and Examples was carried out at an atmospheric pressure of $1.013 \times 10^5$ Pa (1 atm). The tray 5 and a rotation shaft 5b of the tray 5 are made of carbon in the present embodiment, but not limited thereto. The tray 5 and rotation shaft 5b may be made of other materials such as SiC coated carbon, high-purity quartz. The installation plane 5a of the tray 5 is installed to be perpendicular to the source gas flowing direction, but not limited thereto. The installation plane 5a may be installed in the horizontal direction (to be parallel to the source gas flowing direction).

Effects of the First Embodiment

According to the present embodiment, since the gas inlet pipe 60 is partially provided with the opaque section 60b, the waveguiding, i.e. optical waveguiding effect (phenomenon) of the radiant heat from the growing section heater 4b or the growing section 3b to the upstream side of the gas inlet pipe 60 is suppressed, so that it is possible to suppress the temperature rise in vicinity of the gas inlet 65a (the upstream end 65) of the gas inlet pipe 60. As a result, it is possible to suppress the reaction (corrosion) of the pipe made of SUS, i.e. the upstream end 65 with the HCl gas flowing through the upstream end 65, thereby suppress the interfusion of impurities resulted from SUS parts into the nitride semiconductor layers from the upstream end 65 made of SUS.

The Second Embodiment

Figure 3:
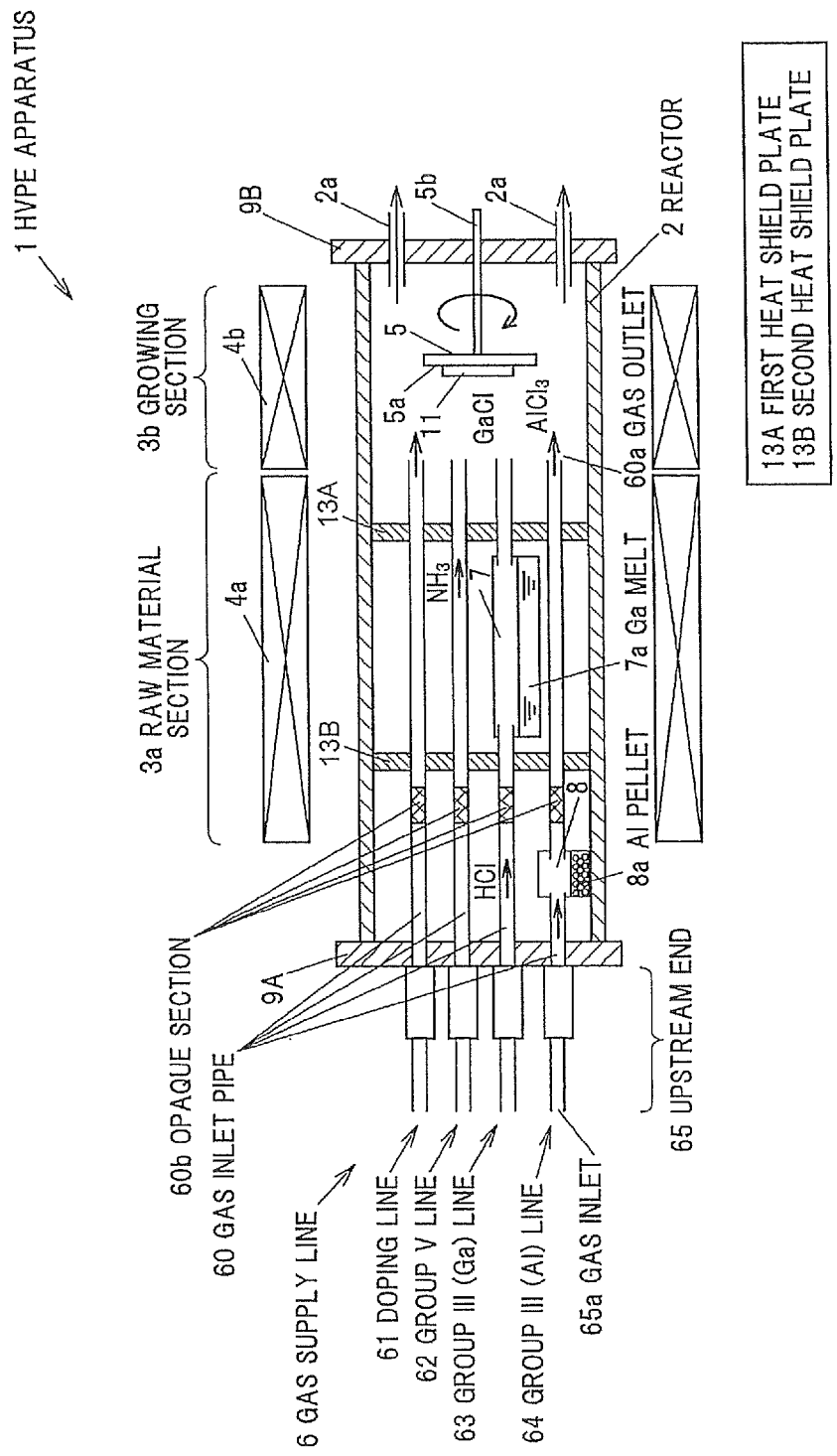
FIG. 3 is a diagram showing an example of schematic configuration of an HVPE apparatus in the second embodiment according to the present invention.

FIG. 3 is a diagram showing an example of schematic configuration of an HVPE apparatus in the second embodiment according to the present invention. The second embodiment is similar to the first embodiment, except a first heat shield plate 13A and a second heat shield plate 13B are added to the HVPE apparatus 1 in the first embodiment.

Namely, in the HVPE apparatus 1 in the second embodiment, the first heat shield plate 13A is disposed between the growing section 3b a temperature of which is the highest in the reactor 2 and the raw material section 3a, and the second heat shield plate 13B is disposed between the upstream flange 9A and the first heat shield plate 13A. By placing the first and second heat shield plates 13A, 13B, it is possible to shield the radiant heat from the growing section 3b, thereby suppress the temperature rise of the region in the vicinity of the gas inlet 65a (the upstream end 65) of the gas supply line 6.

The first and second heat shield plates 13A, 13B may be made of e.g. quartz, carbon, or these materials with coating such as SiC coating. The second heat shield plate 13B on the side of (i.e. closer to) the gas inlet 65a is preferably made of quartz, while the first heat shield plate 13A on the side of (i.e. closer to) the growing section 3b is preferably made of carbon. In addition, although the heat shielding effect is enhanced in accordance with the increase in number of the heat shield plates, the heat shielding effect may be deteriorated if the number of the heat shield plates is too large. Further, a large heat shield effect is provided in the vicinity of the gas inlet 65a (upstream end 65) by the opaque section 60b of the gas supply line 6. Therefore, it is preferable that the number of the heat shield plates 13 is approximately 1 to 5, and a further effect is hardly expected even though a larger number of the heat shield plates are provided.

The Third Embodiment

Figure 4:
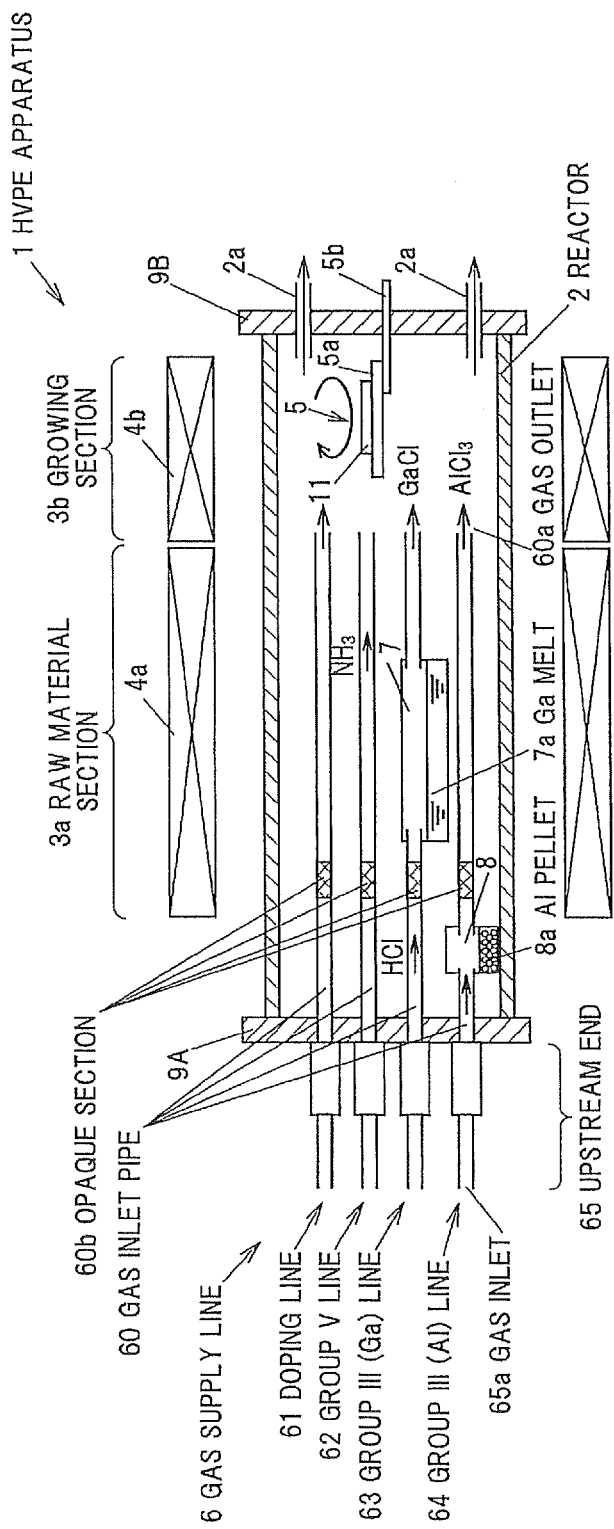
FIG. 4 is a diagram showing an example of schematic configuration of an HVPE apparatus in the third embodiment according to the present invention.

FIG. 4 is a diagram showing an example of schematic configuration of an HVPE apparatus in the third embodiment according to the present invention. The third embodiment is similar to the first embodiment, except the installation plane 5a of the tray 5 is installed in the horizontal direction, namely parallel to the source gas flowing direction. It is configured such that a power transmission direction of the rotation shaft 5b is converted with 90 degrees via a bevel gear to rotate the tray 5.

Effects of the Third Embodiment

Also in the present embodiment, it is possible to suppress the interfusion of the unintended impurities similarly to the first embodiment. By placing the installation plane 5a of the tray 5 in the horizontal direction, namely parallel to the source gas flowing direction, it is possible to achieve a uniform in-plane film thickness easily.

The Fourth Embodiment

Figure 5:
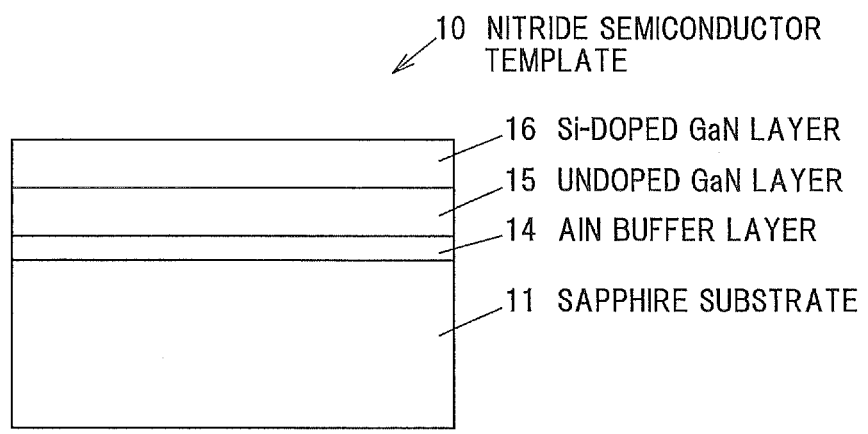
FIG. 5 is a cross-sectional view showing a nitride semiconductor template in the fourth embodiment according to the present invention.

FIG. 5 is a cross-sectional view of a nitride semiconductor template fabricated by a method for fabricating a nitride semiconductor template in the fourth embodiment of the present invention.

A nitride semiconductor template 10 is produced with using the HVPE apparatus 1 as shown in FIG. 1, 3 or 4. The nitride semiconductor template 10 has a sapphire substrate 11, an AlN buffer layer 14 formed on the sapphire substrate 11, an undoped GaN (un-GaN) layer 15 formed as a first layer on the AlN buffer layer 14, and a Si-doped GaN (Si—GaN) layer 16 formed as a second layer on the undoped GaN layer 15. The undoped GaN layer 15 and Si-doped GaN layer 16 are an example of the nitride semiconductor layers.

If the nitride semiconductor template 10 consists of the AlN buffer layer 14 and the undoped GaN layer 15, the crystallinity thereof will be improved. The nitride semiconductor template 10, however, has a portion through which current flows, so that it is naturally necessary to dope the GaN layer with n-type impurities such as Si. Here, it is preferable to provide the Si-doped GaN layer 16 in the nitride semiconductor template 10, and Si concentration of the Si-doped GaN layer 16 is preferably $5\times10^{18}$ cm$^{-3}$ to $5\times10^{19}$ cm$^{-3}$ for this purpose. In this embodiment, the Si concentration is $1\times10^{19}$ cm$^{-3}$. Namely, this embodiment is not configured to improve the crystallinity by lowering the Si concentration, but configured to suppress the contamination by unintended impurities even with the Si concentration in the order of $10^{19}$, thereby narrow the full width at half maximum (FWHM) of a (0004) plane of X-ray diffraction (XRD), to provide the nitride semiconductor template with excellent crystallinity.

Effects of the Fourth Embodiment

According to the present embodiment of the invention, it is possible to provide a nitride semiconductor template 10 which can be suitably used in the high efficiency semiconductor light-emitting device, by the development of metal chloride gas generator as described above which can suppress the contamination by unintended impurities. In addition, it is possible to significantly shorten the growth time by forming a nitride semiconductor with using the HVPE method. As a result, it is possible to provide the nitride semiconductor template 10 for a high performance light-emitting device at a low cost. Namely, this nitride semiconductor template 10 is a template which is useful for fabricating the high-brightness semiconductor light-emitting device.

Next, the present invention will be described in more detail by the following examples. However, the present invention is not limited thereto.

Example 1

First, Example 1 of the present invention will be explained below.

Figure 6A:
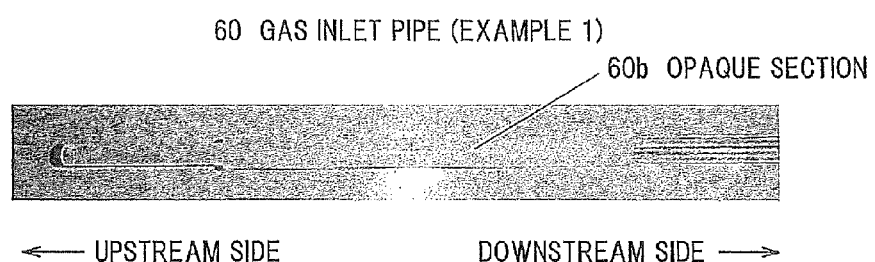
FIG. 6A is a photographic image of a gas inlet pipe in Example 1.
Figure 6B:
FIG. 6B is a photographic image of a gas inlet pipe in Comparative example 1.

In Example 1, a nitride semiconductor template 10 as shown in FIG. 5 was produced with the use of the HVPE apparatus 1 as shown in FIG. 1. In Example 1, a gas inlet pipe 60 composed of a molten quartz glass (e.g. OP-1, OP-3 made by Tosoh Corporation) which is partially provided with the opaque section 60b as shown in FIG. 6A was used for the four system gas supply lines 6. In FIGS. 6A and 6B, the left side is the upstream side and the right side is the downstream side. The length of the opaque section 60b is 100 mm, and the opaque section 60b of the group III (Ga) line 63 was located between the gas inlet 65a and the Ga tank 7. The opaque section 60b of each of the doping line 61, the group V line 62, and the group III (Al) line 64 was located such that a distance from the upstream flange 9A to the opaque section 60b in each of the doping line 61, the group V line 62, and the group III (Al) line 64 is substantially equal to a distance from the upstream flange 9A of the opaque section 60b in the group III (Ga) line 63. Here, FIG. 6B shows a gas inlet pipe 60 with no opaque section 60b which is used as a comparative example to be described later.

As the sapphire substrate 11, a substrate having a thickness of 900 μm and a diameter of 100 mm (4 inches) was used. First, the AlN buffer layer 14 having a film thickness of about 20 nm was formed on the sapphire substrate 11, the undoped GaN layer 15 was grown to have a thickness of about 6 μm on the AlN buffer layer 14, and the Si-doped GaN layer 16 was grown to have a thickness of about 2 μm on the undoped GaN layer 15.

The HVPE growth was carried out as follows. After the sapphire substrate 11 was set on the tray 5 of the HVPE apparatus 1, pure nitrogen was flown thereinto to expel the air in the reactor 2. Next, the sapphire substrate 11 was held for 10 minutes at a substrate temperature of 1100 degrees Celsius in a mixture gas of hydrogen at a flow rate of 3 slm and nitrogen at a flow rate of 7 slm. Thereafter, 100 sccm of HCl gas and 2400 scom of nitrogen as carrier gas were flown from the group III (Al) line 64, and 100 sccm of $NH_3$ and 2400 sccm of hydrogen as carrier gas were flown from the group V line 62 to grow the AlN buffer layer 14. The growth time was 1 minute. This growth time was determined such that the film thickness of the AlN buffer layer 14 will be about 20 nm, based on the growth rate calculated by growing the AlN buffer layer 14 for about 1 μm apart from the above specimen before fabricating the nitride semiconductor template 10.

Through each of the doping line 61 and the group III (Ga) line 63 other than the group III (Al) line 64 and the group V line 62, 2500 sccm of nitrogen gas was flown. The purpose thereof is to keep the total flow amount at a predetermined amount and the total flow amount for this case is 10 slm.

Further, 50 sccm of HCl gas, 1000 sccm of hydrogen, and 1450 sccm of nitrogen were flown from the group III (Ga) line 63, and 2000 sccm of $NH_3$ and 500 sccm of hydrogen as carrier gas were flown from the group V line 62 to grow the undoped GaN buffer layer 15 at a growth rate of 60 μm/hr. The growth time was 6 min. This growth time was also determined based on the growth rate calculated similarly to the growth of the AlN buffer layer 14. Through each of the doping line 61 and the group III (Al) line 64 other than the group III (Ga) line 63 and the group V line 62, 2500 sccm of nitrogen gas was flown.

After the undoped GaN layer 15 was grown as the first layer, the Si-doped GaN layer 16 was successively grown as the second layer by introducing dichlorosilane as Si source from the Si doping line 61 for 2 minutes under the same basic growth conditions as those of the first layer. At this time, a flow amount of dichlorosilane was 100 sccm and a flow amount of the nitrogen gas as the carrier gas was 2400 sccm. At the same time, 2500 sccm of nitrogen gas was flown through the group III (Al) line 64.

After the Si-doped GaN layer 16 was grown, $NH_3$ and nitrogen were flown (with a total flow amount of 10 slm), and the substrate temperature was cooled down until 500 degrees Celsius. After the substrate temperature become lower than 500 degrees Celsius, the flow of $NH_3$ was stopped and only nitrogen gas was supplied (with a total flow amount of 10 slm) such that a nitrogen atmosphere was provided in the reactor 2 and cooled down until a room temperature, then the nitride semiconductor template 10 was taken out.

The full width at half maximum (FWHM) of the (0004) plane of the X-ray diffraction (XRD) of the nitride semiconductor template 10 in Example 1 produced as described above was 225.1 seconds. To analyze the impurities, SIMS analysis was also performed. The elements to be analyzed by SIMS analysis were three kinds of elements, i.e. Fe, Cr and Ni that are considered as impurities resulted from SUS parts.

Figure 7:
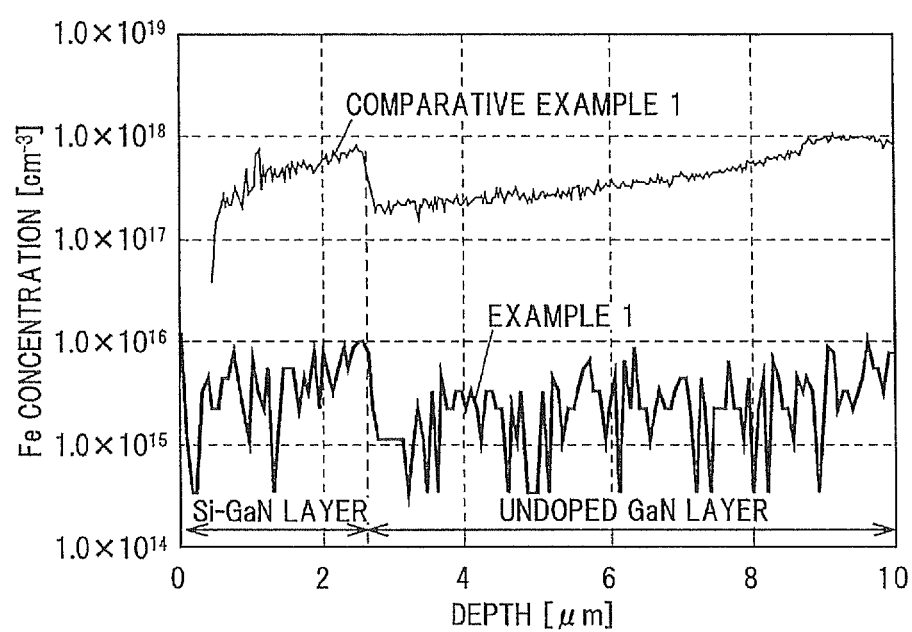
FIG. 7 is a graph showing a result of SIMS analysis of Fe.

FIG. 7 shows the results of SIMS analysis of Fe. For comparison with the conventional arts, FIG. 7 also shows the result of Comparative Example 1. It was confirmed that the Fe concentration of the undoped GaN layer (un-GaN layer) 15 and the Si-doped GaN layer (Si—GaN layer) 16 in Example 1 was about $2 \times 10^{15}$ $cm^{-3}$ that is reduced by about two digit order than the Fe concentration of $2.5 \times 10^{17}$ $cm^{-3}$ to $8.0 \times 10^{17}$ $cm^{-3}$ in Comparative Example 1. The HVPE apparatus and the growth condition of the nitride semiconductor template 10 in Comparative example 1 will be described later.

Figure 8:
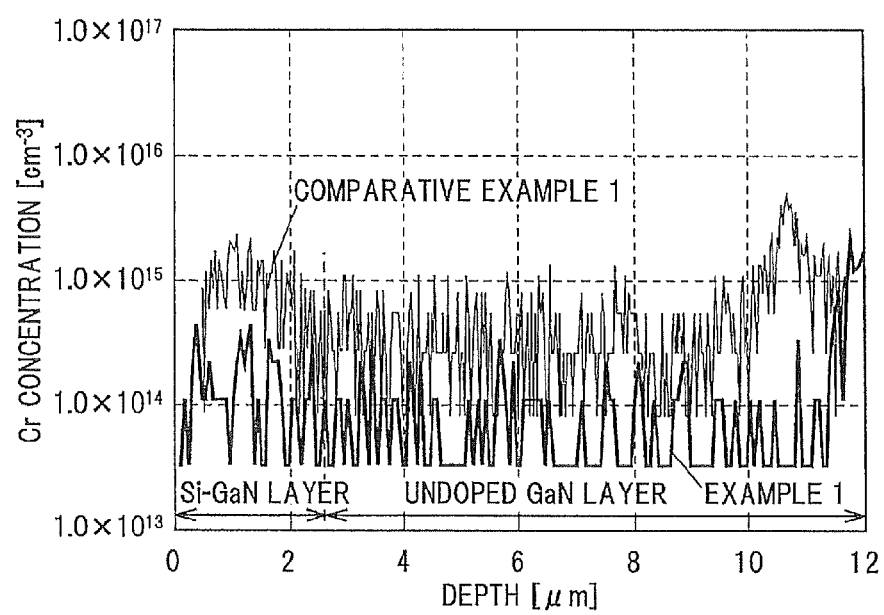
FIG. 8 is a graph showing a result of SIMS analysis of Cr.

FIG. 8 shows the results of SIMS analysis of Cr. For comparison with the conventional arts, FIG. 8 also shows the results of Comparative Example 1. It was confirmed that the Cr concentration of the undoped GaN layer (un-GaN layer) 15 and the Si-doped GaN layer (Si—GaN layer) 16 in Example 1 was $2 \times 10^{14}$ $cm^{-3}$ (the lower detection limit of the SIMS analysis) that is reduced by about two digit order to about ⅕ than the Cr concentration of about $0.2 \times 10^{16}$ $cm^{-3}$ to $2 \times 10^{16}$ $cm^{-3}$ in Comparative Example 1.

Figure 9:
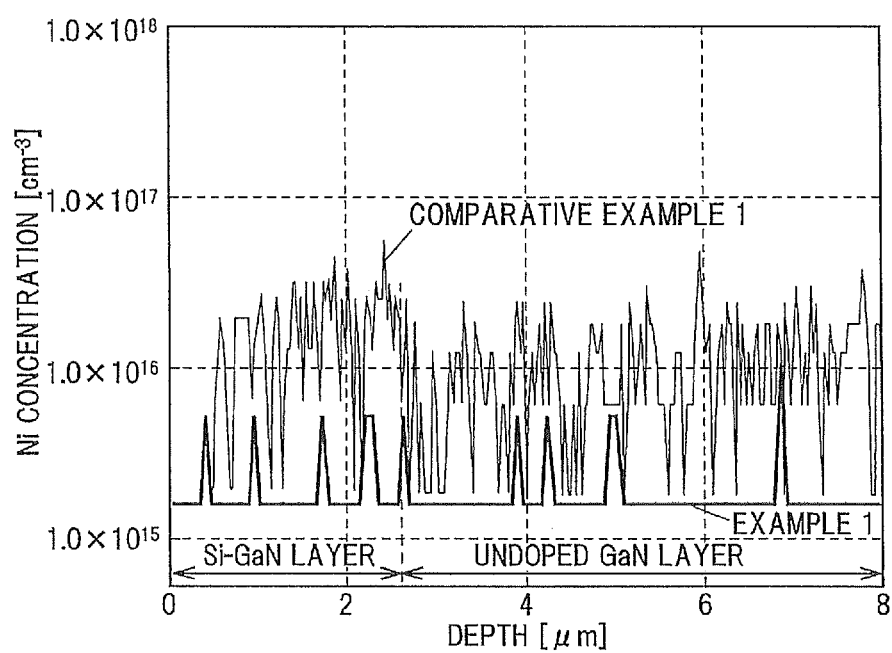
FIG. 9 is a graph showing a result of SIMS analysis of Ni.

FIG. 9 shows the results of SIMS analysis of Ni. For comparison with the conventional arts, FIG. 9 also shows the results of Comparative Example 1. It was confirmed that each of the Ni concentration of the undoped GaN layer (un-GaN layer) 15 and the Si-doped GaN layer (Si—GaN layer) 16 in Comparative Example 1 by the SIMS analysis was about $1.0 \times 10^{16}$ $cm^{-3}$, i.e., detectable, although the dispersion of value was observed. It was confirmed that each of the Ni concentration of the undoped GaN layer (un-GaN layer) 15 and the Si-doped GaN layer (Si—GaN layer) 16 in Example 1 was not more than the lower detection limit of SIMS analysis, i.e. $4 \times 10^{15}$ $cm^{-3}$.

As described above, it is confirmed that the full width at half maximum (FWHM) of the (0004) plane of the X-ray diffraction (XRD) was narrowed and that the crystallinity was improved. The above effects are provided by suppressing the contamination by unintended impurities, and the effects of Example 1 were confirmed. In addition, it is confirmed that Cl is slightly contained in the undoped GaN layer (un-GaN layer) 15 and the Si-doped GaN layer (Si—GaN layer) 16 grown by the HVPE apparatus 1.

From this result, it is confirmed that the quality of the nitride semiconductor template 10 was improved by reducing the unintended impurities. To confirm the effect of this result, an epitaxial growth for a light-emitting device using the MOVPE method on the nitride semiconductor template 10 (see FIG. 10) was performed to produce a semiconductor light-emitting device (see FIG. 11), and the effects thereof were confirmed.

(Method of Manufacturing a Semiconductor Light-Emitting Device)

Next, a method for manufacturing the semiconductor light-emitting device will be described below in conjunction with the drawings.

Figure 10:
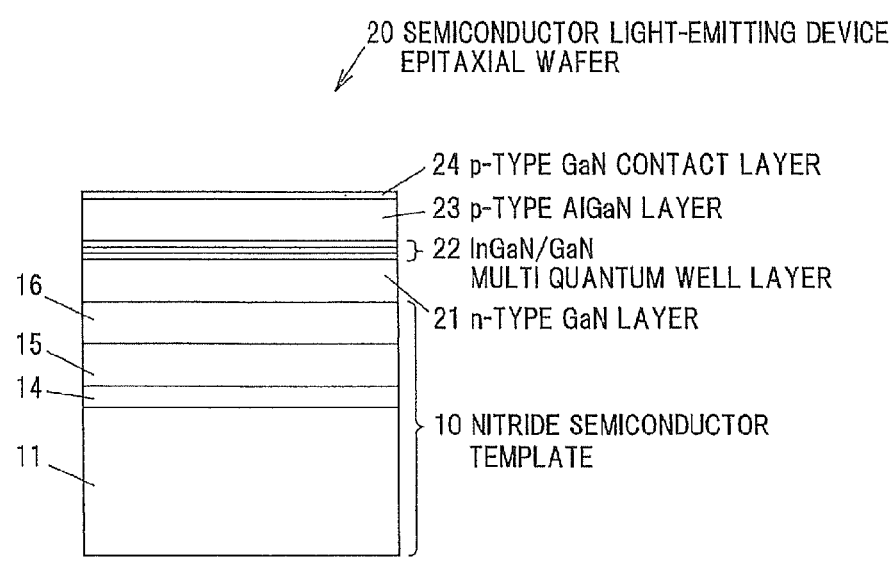
FIG. 10 is a cross-sectional view showing a semiconductor light-emitting device epitaxial wafer in the Example 1.
Figure 11:
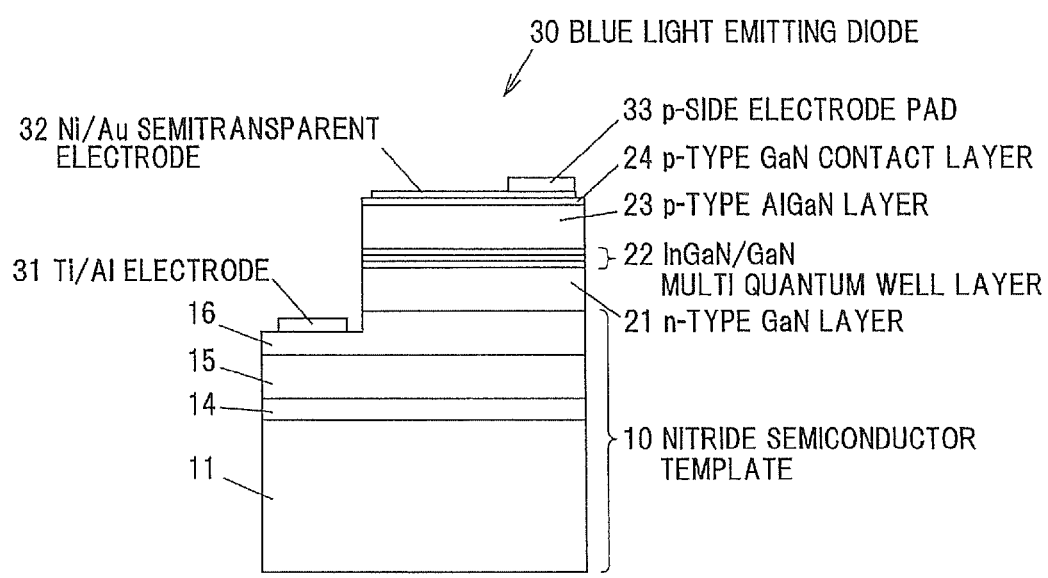
FIG. 11 is a cross-sectional view showing a semiconductor light-emitting device (blue LED element) in the Example 1.

FIG. 10 shows a cross-sectional view of a semiconductor light-emitting device epitaxial wafer 20 in this embodiment, and FIG. 11 is a cross-sectional view of a semiconductor light-emitting device in this embodiment.

More specifically, an n-type GaN layer 21 was grown on the nitride semiconductor template 10 as shown in FIG. 5, six pairs of InGaN/GaN multiple quantum well layers 22 were grown on the n-type GaN layer 21, a p-type AlGaN layer 23 and a p-type GaN contact layer 24 were grown on the InGaN/GaN multiple quantum well layers 22, and after the growth of the laminated structure described above, the temperature of the MOVPE apparatus was lowered to near the room temperature, then a semiconductor light-emitting device epitaxial wafer 20 as shown in FIG. 10 was taken out from the MOVPE apparatus.

Thereafter, a surface of the semiconductor light-emitting device epitaxial wafer 20 thus obtained was partially removed by RIE (Reactive Ion Etching) to expose a part of the n-type Si-doped GaN layer 16 of the nitride semiconductor template 10, and a Ti/Al electrode 31 was formed thereon. Further, a Ni/Au semi-transparent electrode 32 and a p-side electrode pad 33 were formed on the p-type GaN contact layer 24, to provide a semiconductor light-emitting device (blue LED element) 30 as shown in FIG. 11. The semiconductor light-emitting device (blue LED element) 30 is one example of the present embodiment.

The emission characteristic of the semiconductor light-emitting device (blue LED element) 30 was evaluated at a flowing current of 20 mA. The emission peak wavelength was about 450 nm, a forward voltage was 3.25 V, and the emission output was 15 mW. In addition, the reliability test of the semiconductor light-emitting device (bleu LED element) 30 was carried out by electric current applying test for 1000 hr at a flowing current of 50 mA and at a room temperature. As a result, the relative output was 98%, so that a sufficiently good reliability characteristic was confirmed. Here, "relative output"="(emission output after current flow for 1000 hours/initial emission output)×100".

Example 2

In Example 2, a nitride semiconductor template 10 was produced with the use of the HVPE apparatus 1 as shown in FIG. 3. In other words, the nitride semiconductor template 10 was produced with the use of the HVPE apparatus 1 in which the heat shield plates 13 are provided in addition to the HVPE apparatus 1 used in Example 1. Features other than the aforementioned feature such as the fabrication condition of the nitride semiconductor template 10, the method for fabricating the semiconductor light-emitting element (blue LED element) 30 and the analysis method therefor are completely the same as those in the aforementioned Example 1.

The concentration of the unintended impurities of the nitride semiconductor template 10 produced in Example 2 was substantially the same as that in Example 1.

The full width at half maximum (FWHM) of the (0004) plane of the X-ray diffraction (XRD) of the nitride semiconductor template 10 in Example 2 produced as described above was however 213.6 seconds.

All the evaluation results of the semiconductor light-emitting element (blue LED element) 30 produced under the conditions of Example 2 as to the emission peak wavelength, the forward voltage, the emission output and the reliability characteristic were approximately the same as those in Example 1.

Example 3

In Example 3, a nitride semiconductor template 10 was produced with the use of the HVPE apparatus 1 as shown in FIG. 1. In other words, the nitride semiconductor template 10 in Example 3 is almost the same as that in Example 1. Therefore, only the features of Example 3 different from Example 1 will be described.

In Example 1, 100 sccm of HCl gas and 2400 sccm of nitrogen as carrier gas were flown from the group III (Al) line 64, and 100 sccm of NH₃ and 2400 sccm of hydrogen as carrier gas were flown from the group V line 62 to grow the AlN buffer layer 14.

In Example 3, 1400 sccm of nitrogen as carrier gas were flown from the group III (Al) line 64, and 1000 sccm of hydrogen as carrier gas were flown from the group V line 62 to grow the AlN buffer layer 14.

Further, 50 sccm of HCl gas, 2000 sccm of hydrogen, and 450 sccm of nitrogen were flown from the group III (Ga) line 63, and 1500 sccm of NH₃ and 1000 sccm of hydrogen as carrier gas were flown from the group V line 62 to grow the undoped GaN buffer layer 15.

The concentration of the unintended impurities of the nitride semiconductor template 10 produced in Example 3 was substantially the same as that in Example 1.

The full width at half maximum (FWHM) of the (0004) plane of the X-ray diffraction (XRD) of the nitride semiconductor template 10 in Example 3 produced as described above was however 181.3 seconds.

All the evaluation results of the semiconductor light-emitting element (blue LED element) 30 produced under the conditions of Example 3 as to the emission peak wavelength, the forward voltage, the emission output and the reliability characteristic were approximately the same as those in Example 1.

In Example 3, the full width at half maximum (FWHM) of the (0004) plane of the X-ray diffraction (XRD) of the nitride semiconductor template 10 was narrowed, which is the effect of the growth under hydrogen-rich condition.

The hydrogen-rich condition suppresses the lateral growth by the etching effect and the like, thereby accelerates the island growth. Thereafter, the islands are selectively grown by the ELO-like effect, so that the crystal dislocation is reduced. As a result, the full width at half maximum (FWHM) is narrowed.

Example 4

In Example 4, a nitride semiconductor template 10 was produced with the use of the HVPE apparatus 1 as shown in FIG. 1. However, the length of the opaque section 60*b* of each of the gas inlet pipes 60 in Example 4 is different from that in Example 1. In Example 1, the length of the opaque section 60*b* for all of the inlet pipes 60 was 100 mm. On the other hand, in Example 4, the length of the opaque section 60*b* for all of the inlet pipes 60 was 10 mm. The features in Example 4 are the same as those in Example 1, except the above point.

The concentration of the unintended impurities of the nitride semiconductor template 10 produced in Example 4 was substantially the same as that in Example 1.

The full width at half maximum (FWHM) of the (0004) plane of the X-ray diffraction (XRD) of the nitride semiconductor template 10 in Example 4 produced as described above was however 229.3 seconds.

All the evaluation results of the semiconductor light-emitting element (blue LED element) 30 produced under the conditions of Example 4 as to the emission peak wavelength, the forward voltage, the emission output and the reliability characteristic were approximately the same as those in Example 1.

In Example 4, the full width at half maximum (FWHM) of the (0004) plane of the X-ray diffraction (XRD) of the nitride semiconductor template 10 was slightly broadened, namely, slightly deteriorated. It is however a difference which can be considered as a dispersion of the value. Accordingly, it is confirmed that about 10 mm is enough as the length of the opaque section 60*b* of the gas inlet pipe 60. However, since a deteriorating tendency is observed, this result also shows a possibility that the full width at half maximum (FWHM) of the (0004) plane of the X-ray diffraction (XRD) may be remarkably broadened if the length of the opaque section 60b of the gas inlet pipe 60 is shorter than 10 mm.

From the above result, the length of the opaque section 60b of the gas inlet pipe 60 is preferably not less than 10 mm. Further, the length of the opaque section 60b of the gas inlet pipe 60 may be more than 200 mm but the effect provided by the opaque section 60b will be almost unchanged. Therefore, the length of the opaque section 60b of the gas inlet pipe 60 is adjustable within the range of 10 mm to 200 mm, and preferably within the range of about 10 mm to 100 mm.

Example 5

In Example 5, a nitride semiconductor template 10 was produced with the use of the HVPE apparatus 1 as shown in FIG. 4. The HVPE apparatus 1 in FIG. 4 is almost the same as that in FIG. 1, except the tray 5 is installed in the horizontal direction. According to this structure, the sapphire substrate 11 is installed horizontally, since the sapphire substrate 11 is placed on the installation plane 5a.

It is configured such that the sapphire substrate 11 is rotated by the rotation shaft 5b and the gear (not shown) in the tray 5. The nitride semiconductor template 10 was grown under the same conditions as those in Example 1, except the above configuration. Further, the method for fabricating the semiconductor light-emitting device 30 and the like were completely the same as those in Example 1.

The concentration of the unintended impurities of the nitride semiconductor template 10 produced in Example 5 was substantially the same as that in Example 1.

The full width at half maximum (FWHM) of the (0004) plane of the X-ray diffraction (XRD) of the nitride semiconductor template 10 in Example 5 produced as described above was however 210.7 seconds.

All the evaluation results of the semiconductor light-emitting element (blue LED element) 30 produced under the conditions of Example 5 as to the emission peak wavelength, the forward voltage, the emission output and the reliability characteristic were approximately the same as those in Example 1.

Comparative Example 1

Figure 12:
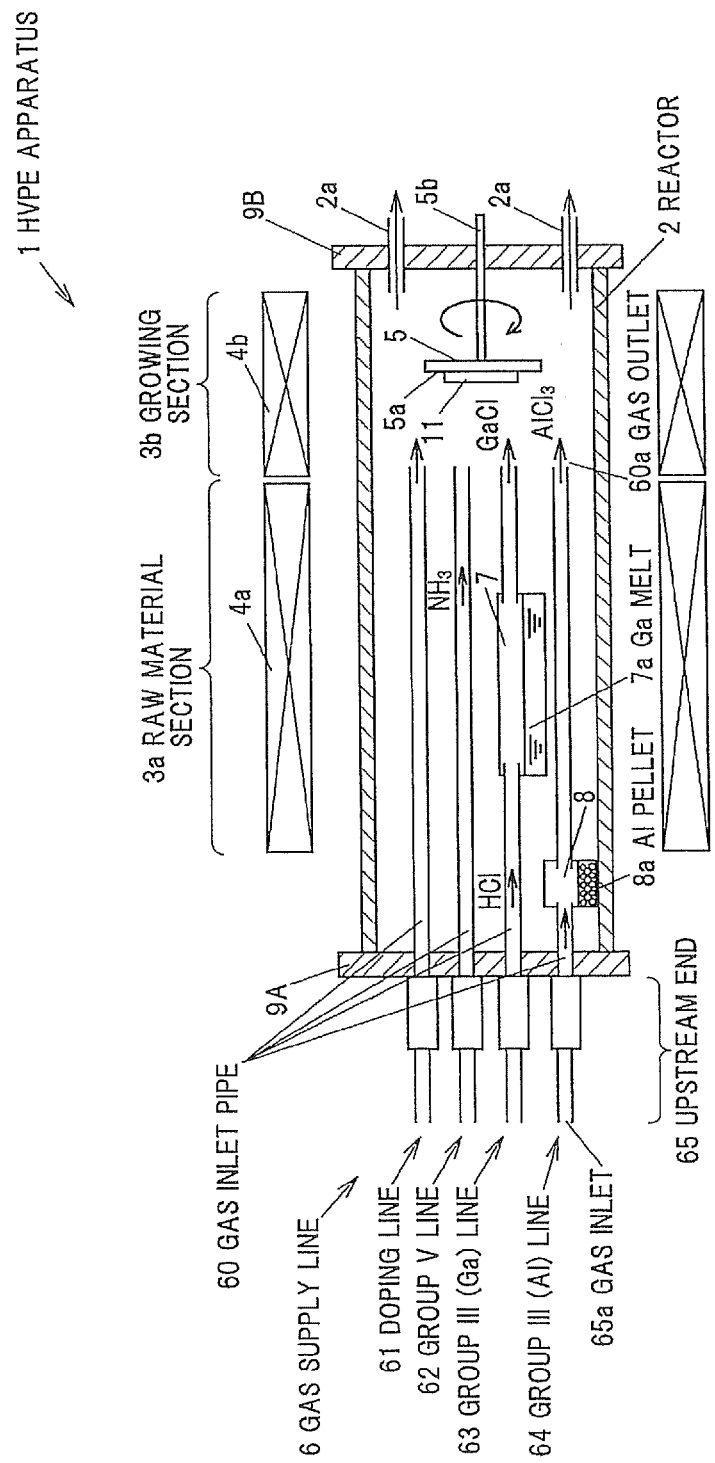
FIG. 12 is a diagram typically showing an HVPE apparatus in the Comparative example 1.

FIG. 12 shows an HVPE apparatus 1 according to Comparative Example 1. The HVPE apparatus 1 in Comparative example 1 is similar to the HVPE apparatus 1 in Example 1, except that the gas supply lines 6 have no opaque section 60b and are entirely made of transparent quartz.

The structure of the nitride semiconductor template 10 fabricated in Comparative Example 1 is the same as that in Examples as shown in FIG. 5, and the growth conditions are also the same as those in Example 1. Further, the structure, manufacturing conditions and growth conditions of a semiconductor light-emitting device epitaxial wafer 20 (see FIG. 10) and a semiconductor light-emitting device (blue LED element) 30 (see FIG. 11) fabricated in Comparative Example 1 are the same as those in Example 1. All features are the same as those in Example 1 except the structure of the HVPE apparatus in which the gas inlet pipe 60 has no opaque section 60b (the gas inlet pipe 60 is completely made of the transparent quartz).

The full width at half maximum (FWHM) of the (0004) plane of the X-ray diffraction (XRD) of the nitride semiconductor template 10 produced as described above was 450.1 seconds. It is understood that the full width at half maximum (FWHM) in Example 1 was approximately halved in comparison with Comparative Example 1, since the full width at half maximum (FWHM) in Example 1 was 225.1 seconds. The explanation with respect to the impurity concentration (see FIGS. 7 to 9) is omitted because it is already described in relation to Example 1.

The emission characteristic of the semiconductor light-emitting device (blue LED element) 30 was evaluated at a flowing current of 20 mA. The emission peak wavelength was about 452 nm, a forward voltage was 3.12 V, and the emission output was 10 mW. Namely, due to the contamination by impurities such as Fe, Cr, and Ni, the crystal defects were increased. As a result, the full width at half maximum was broadened, so that an internal quantum efficiency was deteriorated, thereby the emission output was lowered. Further, it is understood that the leakage current is increased due the crystal defects, so that the forward voltage was lowered. In other words, the contamination by impurities was suppressed in Example 1, so that the internal quantum efficiency was enhanced, thereby the emission output of the semiconductor light-emitting device (blue LED element) 30 was increased.

Further, the reliability test of the semiconductor light-emitting device (blue LED element) 30 in Comparative Example 1 was also carried out. The method and condition for the reliability test were completely the same as those in Example 1. As a result, the relative output was 83% after the current flow for 1000 hr, so that it was confirmed that the reliability characteristic was not so good. It is obvious that the reliability was not good due to the poor crystallinity and light-emitting efficiency. The "relative output" is already shown in Example 1 and defined as follows: "relative output"="(emission output after current flow for 1000 hours/initial emission output)× 100".

Comparative Example 2

As Comparative Example 2, the HVPE apparatus 1 as shown in FIG. 12 was used. The structure of the nitride semiconductor template 10 fabricated in Comparative Example 2 is the same as that in Example 1 as shown in FIG. 5. Further, the growth conditions are also the same as those in Example 1, except the substrate temperature during the growth is 950 degrees Celsius. In brief, Comparative example 2 is the same as Comparative example 1, except the growth temperature.

The purpose for lowering the growth temperature to 950 degrees Celsius is to suppress the rise in temperature at the upstream end 65, thereby suppress the contamination by unintended impurities.

The full width at half maximum (FWHM) of the (0004) plane of the X-ray diffraction (XRD) of the nitride semiconductor template 10 produced as described above was 442.5 seconds. The impurity concentrations are not shown but slightly more than those in Example 1. However, the concentration of the untended impurities was lowered compared with Comparative example 1. Namely, the rise in temperature at the upstream end 65 was suppressed by lowering the growth temperature, and the interfusion of the unintended impurities was suppressed by this effect.

However, the full width at half maximum (FWHM) of the (0004) plane was broadened to 442.5 seconds. It is because that the crystallinity was deteriorated by the low growth temperature. Namely, it is confirmed that the growth temperature of 950 degrees Celsius is not a temperature for achieving the excellent crystal growth.

The emission characteristic of the semiconductor light-emitting device (blue LED element) 30 was evaluated at a flowing current of 20 mA. The emission peak wavelength was about 451 nm, a forward voltage was 3.17 V, and the emission output was 10 mW. Namely, when the contamination by impurities such as Fe, Cr, and Ni is suppressed by lowering the growth temperature, the crystal defects were increased. As a result, the full width at half maximum (FWHM) of the (0004) plane of the X-ray diffraction (XRD) was broadened, so that an internal quantum efficiency was deteriorated, thereby the emission output was lowered. Further, it is understood that the leakage current is increased due the crystal defects, so that the forward voltage was lowered.

Further, the reliability test of the semiconductor light-emitting device (blue LED element) 30 in Comparative Example 2 was also carried out. The method and condition for the reliability test were completely the same as those in Example 1. As a result, the relative output was 84% after the current flow for 1000 hr, so that it was confirmed that the reliability characteristic was not so good. It is obvious that the reliability was not good due to the poor crystallinity and emission efficiency.

(Variation 1)

In the above embodiments of the present invention, a flat sapphire substrate was used. The same effect can also be obtained by using a so-called PSS (Patterned Sapphire Substrate) in which an uneven surface is formed on the sapphire substrate. In the case of using the PSS, the full width at half maximum (FWHM) of the (0004) plane of the X-ray diffraction (XRD) will be narrowed by the ELO-like effect compared with Examples using the flat substrate. Therefore, the full width at half maximum (FWHM) of the (0004) plane in the case of using the PSS is preferably 50 to 250 seconds.

(Variation 2)

In the above embodiments and Examples of the present invention, the growth rate of the GaN layer was 60 μm/hr. The growth rate increased up to about 300 μm/hr is also applicable.

(Variation 3)

Since the above embodiments and Examples relate to a GaN film provided on the substrate, the intended effect of the present invention also can be obtained by using a buffer layer made of a material other than AlN.

(Variation 4)

Figure 13:
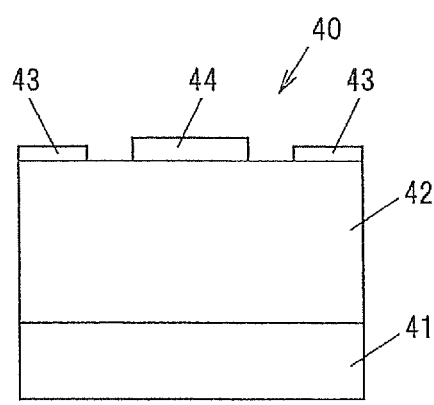
FIG. 13 is a cross-sectional view illustrating a Schottky barrier diode in variation 4 according to the present invention.

FIG. 13 is a cross-sectional view illustrating a Schottky barrier diode 40 according to a Variation 4 of the present invention. A Schottky barrier diode 40 has a sapphire substrate 41, and an n-type GaN layer 42 grown to have a thickness of 3.5 to 8 μm on the sapphire substrate 41, and an ohmic electrodes 43 and a Schottky electrode 44 formed on the n-type GaN layer 42.

The n-type GaN layer 42 is doped with e.g. Si, and the carrier concentration is $4 \times 10^{17}$ cm$^{-3}$.

The ohmic electrode 43 has a two-layer structure made of e.g. Ti/Al provided on the n-type GaN layer 42.

The Schottky electrode 44 has a two-layer structure made of Ni/Au, in which a Ni layer having a thickness of e.g. 50 nm and an Au layer having a thickness of e.g. 500 nm are formed in this order on the n-type GaN layer 42.

(Variation 5)

In the above embodiments and Examples, the gas inlet pipe is partially made of an opaque material. However, the present invention is not limited thereto. It is also possible to use an inlet pipe in which a most part thereof comprises the opaque section and only a portion requiring a high precision comprises a transparent material.

(Variation 6)

Figure 14:
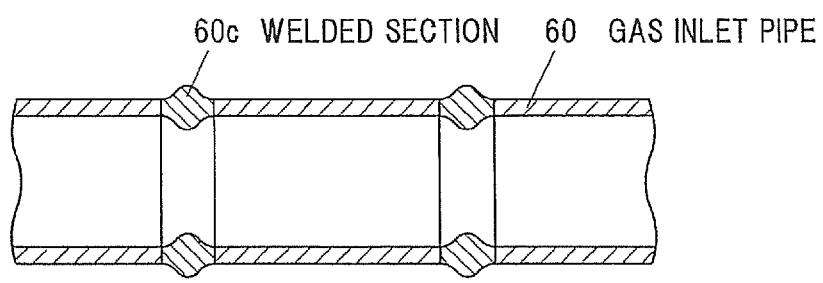
FIG. 14 is a cross-sectional view of an essential part of a gas inlet pipe in variation 6.

In the above embodiments and Examples, the gas inlet pipe is partially made of the opaque material. However, the other techniques may be used as long as the optical waveguiding phenomenon can be suppressed. For example, as shown in FIG. 14, gas inlet pipes 60 composed of the transparent quartz glass may be connected at welded sections 60c that are connecting points. Since the welded section 60c comprises an inwardly protruded convex portion, the light is scattered by the convex portion, so that the light is shielded to some extent. It would be obvious that the same effect as the present invention might be achieved by providing such connecting portions are provided at plural locations. Further, it is also conceivable to scatter the light by providing a convex portion inside the quartz inlet pipe which will not adversely affect the crystal growth.

(Variation 7)

It would be obvious that the same effect as the present invention might be achieved by making the gas inlet pipe from a transparent synthetic quartz glass and forming fine convexo-concave portions (uneven surface) inside or outside of a portion of the gas inlet pipe, or alternatively inside and outside of the portion of the gas inlet pipe to provide the so-called fogged glass. As the method for providing the transparent quartz glass with the fogged glass-like configuration, the sand blasting or the like may be used.

(Variation 8)

In the above embodiments and above Examples, the nitride semiconductor template is explained as a nitride semiconductor. However, the same effect would be naturally achieved by fabricating a free-standing substrate with the use of the metal chloride gas generator of the present invention.

In addition, the present invention is not limited to the above embodiments, examples, and variations, and it is possible to implement various modifications without going beyond the gist of the invention. For example, in the above embodiment and examples, the case of applying a metal chloride gas generator to the HVPE method is described, however, the present invention is not limited thereto, and may be applied to other growing methods.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A metal chloride gas generator, comprising:
   a reactor including a receiving section for receiving a metal on an upstream side and a growing section in which a growth substrate is placed on a downstream side;
   a raw material section heater and a growing section heater each of which heats an inside of the reactor;
   an upstream end comprising a gas inlet; and
   a gas inlet pipe arranged to extend from the upstream end via the receiving section to the growing section, for introducing a chloride gas from the upstream end to supply the chloride gas to the receiving section and supplying a metal chloride gas produced by a reaction between the chloride gas and the metal in the receiving section to the growing section,
   wherein the gas inlet pipe comprises a suppressing section for suppressing an optical waveguiding phenomenon which waveguides a radiant heat from the growing section heater or the growing section.

2. The metal chloride gas generator according to claim 1, wherein the gas inlet pipe comprises a quartz glass and the suppressing section comprises an opaque section comprising an opaque quartz glass.

3. The metal chloride gas generator according to claim 2, wherein a longitudinal length of the opaque section of the gas inlet pipe is not less than 10 mm and not more than 200 mm.

4. The metal chloride gas generator according to claim 3, wherein the receiving section comprises a Ga tank and the opaque section of the gas inlet pipe is located between the upstream end and the Ga tank.

5. The metal chloride gas generator according to claim 1, wherein the suppressing section of the gas inlet pipe comprises a convex portion provided at the gas inlet pipe.

6. The metal chloride gas generator according to claim 1, further comprising a heat shield plate provided in the reactor for thermally shielding between the upstream end and the growing section.

7. A hydride vapor phase epitaxy growth apparatus, comprising:
the metal chloride gas generator according to claim 1.

8. A method for fabricating a nitride semiconductor template comprising a nitride semiconductor provide on a heterogeneous substrate, the method comprising:
arranging the heterogeneous substrate at a downstream side of a reactor comprising a growing section heater for heating the heterogeneous substrate at a predetermined temperature and a gas inlet pipe at an upstream side, and supplying a source gas containing a corrosive gas over the heterogeneous substrate through the gas inlet pipe at the upstream side, the gas inlet pipe comprising a suppressing section for suppressing an optical waveguiding phenomenon which waveguides a heat radiant from the growing section heater or the heterogeneous substrate, to make the nitride semiconductor layer contain chlorine, iron with a concentration of less than $1 \times 10^{17}$ cm$^{-3}$ and chromium with a concentration of less than $1 \times 10^{16}$ cm$^{-3}$.

* * * * *